United States Patent
Johnson

(10) Patent No.: US 6,738,409 B2
(45) Date of Patent: May 18, 2004

(54) CURRENT CONFINEMENT, CAPACITANCE REDUCTION AND ISOLATION OF VCSELS USING DEEP ELEMENTAL TRAPS

(75) Inventor: Ralph H. Johnson, Murphy, TX (US)

(73) Assignee: Honeywell International Inc., Morristown, NJ (US)

( * ) Notice: Subject to any disclaimer, the term of this patent is extended or adjusted under 35 U.S.C. 154(b) by 166 days.

(21) Appl. No.: 10/028,303

(22) Filed: Dec. 28, 2001

(65) Prior Publication Data

US 2003/0123512 A1 Jul. 3, 2003

(51) Int. Cl.[7] ............................................... H01S 5/183
(52) U.S. Cl. .............................. 372/96; 372/46; 372/50
(58) Field of Search ............................... 372/46, 50, 96

(56) References Cited

U.S. PATENT DOCUMENTS 5,893,722 A * 4/1999 Hibbs-Brenner et al. ...... 438/45
5,918,108 A * 6/1999 Peters ........................... 438/29

OTHER PUBLICATIONS

Jaime M. Martin et al., "Fe and Ti Implants in $In_{0.52}Al_{0.48}As$", Journal of Electronic Materials, vol. 22, No. 9, 1993, ppgs. 1153–1157.

* cited by examiner

Primary Examiner—James W Davie
(74) Attorney, Agent, or Firm—Andrew A. Abeyta

(57) ABSTRACT

A VCSEL having a current confinement structure comprised of deep traps formed by implanting either iron (Fe) or chrome (Cr) into a group III-V compound, such as InP or GaAs. Beneficially, the VCSEL is part of an array of VCSELs produced on a common substrate.

21 Claims, 2 Drawing Sheets

CURRENT CONFINEMENT, CAPACITANCE REDUCTION AND ISOLATION OF VCSELS USING DEEP ELEMENTAL TRAPS

CROSS-REFERENCE TO RELATED APPLICATIONS

Not applicable.

BACKGROUND OF THE INVENTION

1. Field of the Invention

This invention relates to current confinement and isolation in vertical cavity surface emitting lasers.

2. Discussion of the Related Art

Vertical cavity surface emitting lasers (VCSELs) represent a relatively new class of semiconductor lasers. While there are many variations of VCSELs, one common characteristic is that they emit light perpendicular to a wafer's surface. Advantageously, VCSELs can be formed from a wide range of material systems to produce specific characteristics. In particular, the various material systems can be tailored to produce different laser wavelengths, such as 1550 nm, 1310 nm, 850 nm, 670 nm, and so on.

VCSELs usually include semiconductor active regions, distributed Bragg reflector (DBR) mirrors, spacers, current confinement structures, substrates, and contacts. Because of their relatively complicated structure and because of their material requirements, VCSELs are usually grown using metal-organic chemical vapor deposition (MOCVD).

FIG. 1 illustrates a typical VCSEL 10. As shown, an n-doped gallium arsenide (GaAS) or an indium phosphorus (InP) substrate 12 has an n-type electrical contact 14. An n-doped lower mirror stack 16 (a DBR) is on the substrate 12, and an n-type graded-index lower spacer 18 is disposed over the lower mirror stack 16. An active region 20, usually having a number of quantum wells, is formed over the lower spacer 18. A p-type graded index top spacer 22 is disposed over the active region 20, and a p-type top mirror stack 24 (another DBR) is disposed over the top spacer 22. Over the top mirror stack 24 is a p-type conduction layer 9, a p-type cap layer 8, and a p-type electrical contact 26.

Still referring to FIG. 1, the lower spacer 18 and the top spacer 22 separate the lower mirror stack 16 from the top mirror stack 24 such that an optical cavity is formed. As an optical cavity is resonant only at specific wavelengths, the mirror separation is controlled to resonant at a predetermined wavelength (or at a multiple thereof). At least part of the top mirror stack 24 includes an insulating region 40 that provides current confinement. The insulating region 40 is usually formed either by implanting protons into the top mirror stack 24, or by forming an oxide layer. Either way, the insulating region 40 defines a conductive annular central opening 42. Thus, the central opening 42 forms an electrically conductive path though the insulating region 40 to the active region.

In operation, an external bias causes an electrical current 21 to flow toward from the p-type electrical contact 26 toward the n-type electrical contact 14. The insulating region 40 and the conductive central opening 42 confine the current 21 such that it flows through the conductive central opening 42 and into the active region 20. Some of the electrons in the current 21 are converted into photons in the active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 1, the light 23 passes through the p-type conduction layer 9, through the p-type cap layer 8, through an aperture 30 in the p-type electrical contact 26, and out of the surface of the vertical cavity surface emitting laser 10.

It should be understood that FIG. 1 illustrates a typical VCSEL, and that numerous variations are possible. For example, the dopings can be changed (say, by providing a p-type substrate 12), different material systems can be used, operational details can be tuned for maximum performance, and additional structures, such as tunnel junctions, can be added.

While generally successful, VCSELs have problems. For example, in some material systems producing an insulating region 40 using either proton implantation or oxide isolation is not practical. Implanted ions do not produce suitable trap levels while oxide layers are difficult to implement. These problems are particularly apparent in long wavelength VCSELs, and especially in long wavelength VCSELs arrays. Not only do long wavelength VCSELs require current confinement, but low capacitance and easy manufacturing are also required. With VCSEL arrays it is important to isolate the individual VCSEL elements. Typically, current confinement and isolation in long wavelength VCSELs are produced using either a patterned tunnel junction, which has high capacitance, or an undercut etch, which does not lend itself to easy manufacturing.

The transition metals and oxygen are good sources of deep traps that are not related to the implant damage, but are related to the element themselves. In particular, Cr, and Fe have been used to dope during growths of GaAs and InP substrates and epilayers so as to obtain semi-insulating behavior. Cr is used more in GaAs while Fe more in InP. Oxygen has been implanted in several kind of devices, including GaAs based VCSELs, for isolation and current guiding. However, it has not been used in InP based VCSELs.

Therefore, a VCSEL having a new current confinement structure would be beneficial. Even more beneficial would be a new current confinement structure that has low capacitance and that is easy to manufacture. Also beneficial would be a new current confinement structure that has low capacitance, that is easy to manufacture, and that provides good isolation between VCSEL elements in a VCSEL array.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

Accordingly, the principles of the present invention are directed to a VCSEL having a new current confinement structure. Those principles further provide for a current confinement structure that has low capacitance and that is easy to manufacture. A current confinement structures according to the principles of the present invention can also provide good isolation between VCSEL elements in a VCSEL array.

A VCSEL according to the principles of the present invention includes a current confinement structure formed from deep traps in a top DBR mirror and/or in a top spacer. Isolation between VCSEL elements in a VCSEL array can be provided by extending the deep traps into an active layer.

The deep traps are produced by implanting transition metals, for example Fe or Cr into a III-V substrate (such as Inp or GaAs). The energy and dosage used when implanting can be tailored to control the lateral sheet resistance and/or the isolation. Furthermore, the implants beneficially extend over a significant depth, thereby reducing the capacitance across the resulting VCSEL.

The elements that are suitable for implantation include Ti, V, Cr, Mn, Fe, Co, Ni, Zr, Nb, Mo, Tc, Ru, Rh, Pd Ag, Hf, Ta, W, Re, Os, Ir, Pt, Au. The preferred subset (because of their abundance and known characteristics) includes Ti, V, Cr, Mn, Fe, Co, Ni. In addition, oxygen is well suited to implantation. Elements which may work include numbers 58–71, and 90–103.

Beneficially, after implanting deep elemental traps to make a material semi-insulating, an implant anneal is performed. Such annealing is typically performed between 700 and 950 C., with a longer annealing time being used at lower temperatures.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

In the drawings.

Figure 1:
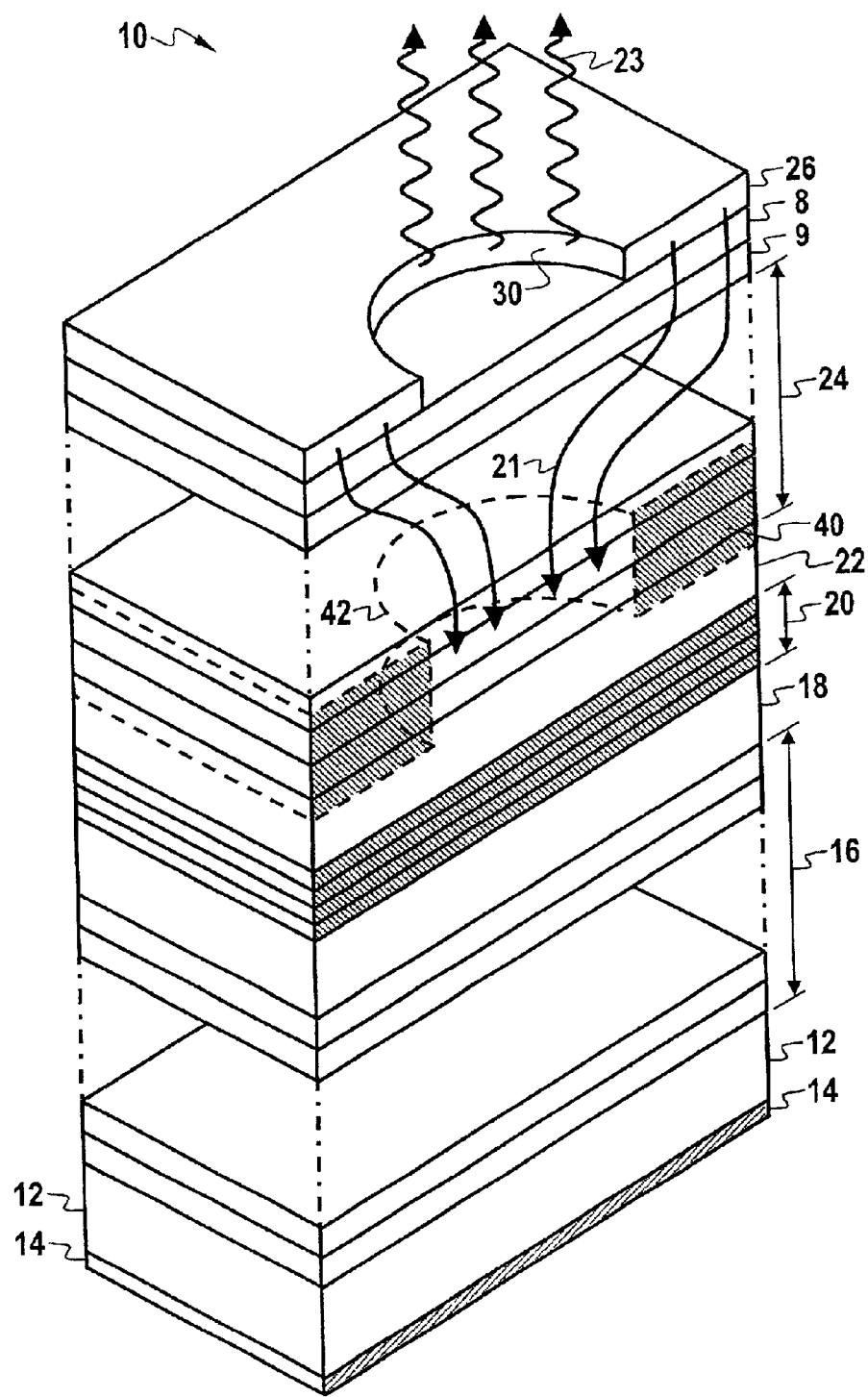
FIG. 1 illustrates a typical vertical cavity surface emitting laser.

Note that in the drawings that like numbers designate like elements. Additionally, for explanatory convenience the descriptions use directional signals such as up and down, top and bottom, and lower and upper. Such signals, which are derived from the relative positions of the elements illustrated in the drawings, are meant to aid the understanding of the present invention, not to limit it.

DETAILED DESCRIPTION OF THE ILLUSTRATED EMBODIMENTS

Reference will now be made in detail to an embodiment of the present invention, example of which is illustrated in the accompanying drawings.

Figure 2:
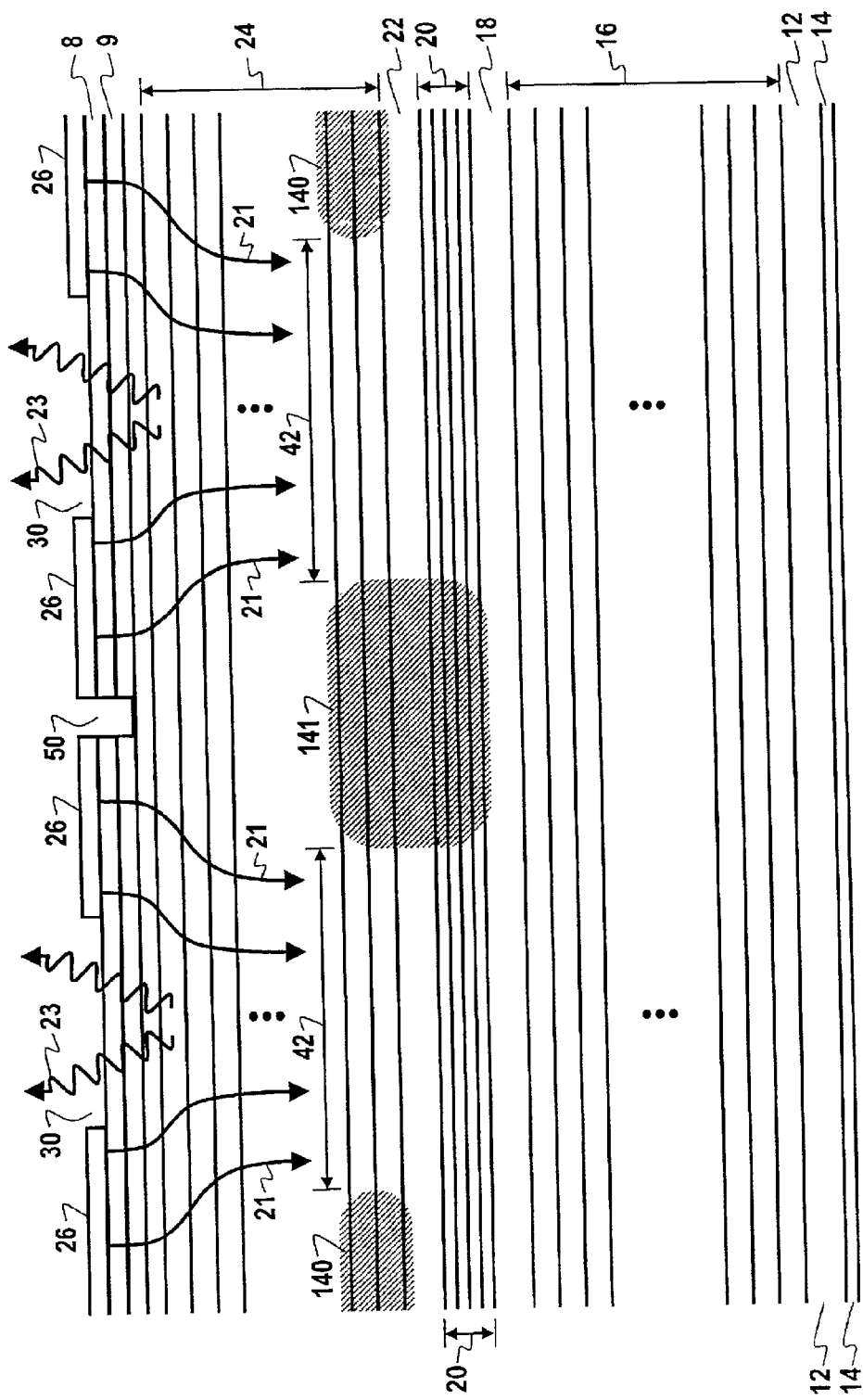
FIG. 2 illustrates a vertical cavity surface emitting laser array that is in accord with the principles of the present invention.

The principles of the present invention provide for VCSELs and VCSEL arrays that have current confinement structures comprised of deep traps created by implanted elements such as Ti, V, Cr, Mn, Fe, Co, Ni, Zr, Nb, Mo, Tc, Ru, Rh, Pd Ag, Hf, Ta, W, Re, Os, Ir, Pt, Au, or O. An example of such a VCSEL and VCSEL array is the VCSEL array 100 illustrated in FIG. 2. FIG. 2 should be understood as a "cut-away" schematic depiction of a section of a VCSEL array that includes individual VCSELs that are generally configured as the VCSEL shown in FIG. 1. Thus, the same numbers will be used for similar elements in FIG. 2 that were used in FIG. 1.

As shown in FIG. 2, the VCSEL array 100 includes an n-doped III-V substrate 12 (beneficially GaAs or InP) having an n-type electrical contact 14. An n-doped lower mirror stack 16 (a DBR) is on the GaAS substrate 12, and an n-type graded-index lower spacer 18 is disposed over the lower mirror stack 16.

Active regions 20 having P-N junction structures with a larger number of quantum wells are formed over the lower spacer 18. While FIG. 2 shows two active regions, in practice a VCSEL array can have a large number of individual active regions. The active regions 20 are comprised of a plurality of alternating III-V semiconductor layers that differ to form PN junctions. The active regions define the locations of the individual VCSELs.

On the active regions 20 is a p-type graded-index top spacer 22. A p-type top mirror stack 24 (another DBR) is disposed over the top spacer 22. As in the VCSEL 10 (see FIG. 1), the lower spacer 18 and the top spacer 22 separate the lower mirror stack 16 from the top mirror stack 24 such that an optical cavity that is resonant at a specific wavelength is formed. Over the top mirror stack 24 are p-type conduction layers 9, p-type cap layers 8, and p-type electrical contacts 26. A channel 50 separates the p-type conduction layers 9, p-type cap layers 8, and p-type electrical contacts 26 of one VCSEL from the adjacent VCSEL.

Still referring to FIG. 2, the top mirror stack 24, and part of the top spacer 22 include implant regions. Those implant regions can be of two types, with FIG. 2 showing each type. The first type is a non-extended implant region 140 that does not extend into an active layer 20. The other is an extended implant region 141 that does extend into an active layer 20. Both types are beneficial, the extended implant region 141 provides improved isolation between adjacent VCSELs, while the non-extend extended implant region 140 is easier to produce without excessive damage to the active regions 20. With either type of implant region, a central opening 42 is defined by the implant region.

In operation, an external bias is applied to the electrical contact 26 of one VCSEL. This causes an electrical current 21 to flow from that p-type electrical contact 26 toward the n-type electrical contact 14. The implant regions (140 and/or 141) and the central opening 42 associated with the electrical contact confines current flow into the active region 20 of the powered VCSEL. Some of the electrons in the current 21 are converted into photons in that active region 20. Those photons bounce back and forth (resonate) between the lower mirror stack 16 and the top mirror stack 24. While the lower mirror stack 16 and the top mirror stack 24 are very good reflectors, some of the photons leak out as light 23 that travels along an optical path. Still referring to FIG. 2, the light 23 passes through the p-type conduction layer 9, through the p-type GaAs cap layer 8, through an aperture 30 in the p-type electrical contact 26, and out of the surface of the powered VCSEL.

The implant regions, 140 and 141, are formed from deep traps produced by implanting either Fe or Cr into the top mirror 24. Alternatively, other elements, such as Ti, V, Cr, Mn, Fe, Co, Ni, Zr, Nb, Mo, Tc, Ru, Rh, Pd Ag, Hf, Ta, W, Re, Os, Ir, Pt, Au can be used to form the deep traps (beneficially, the implanted element is Ti, V, Cr, Mn, Fe, Co, or Ni). Oxygen is also well suited for implantation. Elements that may work include numbers 58–71, and 90–103.

This can be performed during fabrication of the top mirror, immediately after fabrication of the top mirror, or if a sufficiently high-powered implant device is available, after the VCSEL is substantially complete. If implantation is performed through a substantially complete device the implant regions extends through the top mirror 24 (and possible through the conduction layer and the cap layer). The implantation energy and dose of the implanted Fe or Cr can be tailored to provide the required lateral sheet resistance and isolation.

An advantage of implanting Fe or Cr is that the capacitance across the VCSEL can be decreased over that of some other types of prior art long wavelength VCSELs, while device fabrication is simplified. Capacitance is reduced because the relatively thick implant region increases charge separations, which reduces capacitance. Manufacturing difficulty is eased because isolation trenches (for oxidation an/or device separation) are not required. Furthermore, standard implant techniques can be used. Finally, the separation between adjacent individual VCSELs can be improved and/or simplified.

The ability of the elements to render a material semi-insulating is dependent upon their ability to pin the Fermi-level at or near mid gap. While these elements are expected to have deep traps which are near mid gap, if they are for example acceptor levels and the background is p-type then they do not compensate the doping and semi-insulating behavior is not achieved. For an acceptor trap the background shallow impurity must be n-type, and for a deep donor type trap, the background shallow impurity concentration must be p type. Many of these elements are both deep acceptors and donors so that they will compensate either type and a particular background is not required.

An advantage of using elemental traps instead of implant damage traps, other than their appropriate level, is the ability to do more epitaxy following the implantation. If implant damage by itself were used as with proton implants the epitaxy step would anneal out the damage. This gives the ability to bury the insulating layers more deeply with lower energy implants, which is especially useful for current guiding layers in VCSELs.

Another way to deeply bury the insulating region is to use a higher energy implantation using a high energy implanter, or a lower energy implanter with multiple ionization such as can be obtained with an electron-cyclotron resonance source (ECR source).

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A vertical cavity surface emitting laser, comprising:
   a substrate having a first surface and a second surface;
   a first contact layer on said first surface;
   an active region adjacent said substrate;
   a first mirror between said active region and said second surface;
   a second contact layer adjacent said active region; and
   a second mirror between said second contact layer and said active region;
   wherein said second mirror includes deep elemental traps that form a current confinement structure in said second mirror.

2. A vertical cavity surface emitting laser according to claim 1, wherein said deep elemental traps are produced by implanting an element selected from the group consisting of Ti, V, Cr, Mn, Fe, Co, Ni, Zr, Nb, Mo, Tc, Ru, Rh, Pd Ag, Hf, Ta, W, Re, Os, Ir, Pt, Au, and O into the second mirror.

3. A vertical cavity surface emitting laser according to claim 2, wherein said vertical cavity surface emitting laser is annealed to remove implant damage.

4. A vertical cavity surface emitting laser according to claim 1, wherein said deep elemental traps are produced by implanting Fe into the second mirror.

5. A vertical cavity surface emitting laser according to claim 1, wherein said active region includes a group III-V compound.

6. A vertical cavity surface emitting laser according to claim 5, wherein said active region includes Inp.

7. A vertical cavity surface emitting laser according to claim 5, wherein said active region includes GaAs.

8. A vertical cavity surface emitting laser according to claim 1, wherein said deep elemental traps are produced by implanting Cr into the second mirror.

9. A vertical cavity surface emitting laser, comprising:
   a substrate having a first surface and a second surface;
   a first contact layer on said first surface;
   an active region adjacent said substrate;
   a first mirror between said active region and said second surface;
   a second contact layer adjacent said active region;
   a second mirror between said second contact layer and said active region; and
   a spacer between said second mirror and said active region;
   wherein said spacer includes deep elemental traps that form a current confinement structure.

10. A vertical cavity surface emitting laser according to claim 9, wherein said deep elemental traps are produced by implanting an element selected from the group consisting of Ti, V, Cr, Mn, Fe, Co, Ni, Zr, Nb, Mo, Tc, Ru, Rh, Pd Ag, Hf, Ta, W, Re, Os, Ir, Pt, Au, and O into the spacer.

11. A vertical cavity surface emitting laser according to claim 9, wherein said deep elemental traps are produced by implanting Fe into the spacer.

12. A vertical cavity surface emitting laser according to claim 9, wherein said active region includes a group III-V compound.

13. A vertical cavity surface emitting laser according to claim 12, wherein said active region includes InP.

14. A vertical cavity surface emitting laser according to claim 12, wherein said active region includes GaAs.

15. A vertical cavity surface emitting laser according to claim 9, wherein said deep elemental traps are produced by implanting Cr into the spacer.

16. An array of vertical cavity surface emitting lasers, comprising:
- a substrate having a first surface and a second surface;
- a first contact layer on said first surface;
- a plurality of active regions adjacent said substrate for emitting light;
- a first mirror between said plurality of active regions and said second surface;
- a plurality of second contact layers, each adjacent an associated active region; and
- a second mirror between said plurality of second contact layers and said plurality of active regions;
- wherein said array includes a plurality of deep elemental trap regions that form current confinement structures that guide current from said plurality of second contact layers into said plurality of active regions.

17. An array of vertical cavity surface emitting lasers according to claim 16, wherein said deep traps are produced by implanting an element selected from the group consisting of Ti, V, Cr, Mn, Fe, Co, Ni, Zr, Nb, Mo, Tc, Ru, Rh, Pd Ag, Hf, Ta, W, Re, Os, Ir, Pt, Au, and O.

18. An array of vertical cavity surface emitting lasers according to claim 16, wherein said deep traps are produced by implanting Fe.

19. An array of vertical cavity surface emitting lasers according to claim 16, wherein said deep traps are produced by implanting Cr.

20. An array of vertical cavity surface emitting lasers according to claim 16, wherein each active region includes at least one quantum well.

21. An array of vertical cavity surface emitting lasers according to claim 17, wherein the element is implanted into the active region.

* * * * *

UNITED STATES PATENT AND TRADEMARK OFFICE
CERTIFICATE OF CORRECTION

PATENT NO. : 6,738,409 B2  Page 1 of 1
DATED : May 18, 2004
INVENTOR(S) : Ralph H. Johnson It is certified that error appears in the above-identified patent and that said Letters Patent is hereby corrected as shown below:

Column 1,
Line 33, change "(GaAS)" to -- (GaAs) --.
Line 48, after "controlled to" change "resonant" to -- resonate --.

Column 2,
Line 20, after "wavelength" change "VCSELs" to -- VCSEL --.

Column 3,
Line 2, change "Inp" to -- InP --.
Line 9, after "Pd" insert -- , --.
Line 60, before "example" insert -- an --.
Line 66, after "Pd" insert -- , --.

Column 4,
Lines 1 and 7, remove "100".
Line 10, change "GaAS" to -- GaAs --.
Line 65, after "Pd" insert -- , --.

Column 5,
Line 8, after "regions" change "extends" to -- extend --.
Line 9, before "through the conduction" change "possible" to -- possibly --.
Line 33, change "p type" to -- p-type --.

Column 6,
Lines 18 and 53, after "Pd" insert -- , --.
Line 30, change "Inp." to -- InP. --.

Signed and Sealed this

Seventh Day of March, 2006

JON W. DUDAS
*Director of the United States Patent and Trademark Office*